(12) United States Patent
Hong et al.

(10) Patent No.: US 9,236,169 B2
(45) Date of Patent: Jan. 12, 2016

(54) ELECTROMAGNETIC WAVE SHIELDING STRUCTURE AND METHOD FOR FABRICATING THE SAME

(71) Applicant: INDUSTRIAL TECHNOLOGY RESEARCH INSTITUTE, Chutung, Hsinchu (TW)

(72) Inventors: Ming-Tsung Hong, Sanchong (TW); Yun-Ching Lee, Ji'an Township, Hualien County (TW); Li-Chun Liang, Zhudong Township, Hsinchu County (TW); Wei-Ta Yang, Jhongli (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 88 days.

(21) Appl. No.: 13/891,017

(22) Filed: May 9, 2013

(65) Prior Publication Data

US 2014/0141232 A1 May 22, 2014

(30) Foreign Application Priority Data

Nov. 21, 2012 (TW) .............................. 101143371 A (51) Int. Cl.
*H01B 13/30* (2006.01)
*H05K 1/02* (2006.01)
*H05K 1/03* (2006.01)
*H05K 3/28* (2006.01)

(52) U.S. Cl.
CPC .............. *H01B 13/30* (2013.01); *H05K 1/0218* (2013.01); *H05K 1/0393* (2013.01); *H05K 3/281* (2013.01); *Y10T 428/249958* (2015.04); *Y10T 428/249982* (2015.04); *Y10T 428/249985* (2015.04)

(58) Field of Classification Search
CPC ............. H01B 5/14; H01B 13/30; H01B 1/00
See application file for complete search history.

(56) References Cited

U.S. PATENT DOCUMENTS

| 4,289,534 A | 9/1981 | Deffeyes et al. |
| 6,210,787 B1 | 4/2001 | Gogo et al. |
| 6,884,936 B2 | 4/2005 | Takahashi et al. |
| 7,709,750 B2 | 5/2010 | Hashimoto et al. |
| 2005/0173145 A1 | 8/2005 | Ohtsuka et al. |

(Continued)

FOREIGN PATENT DOCUMENTS

| CN | 101120627 | 2/2008 |
| CN | 101176388 | 5/2008 |

(Continued)

OTHER PUBLICATIONS

Office Action from corresponding Taiwanese application mailed Oct. 20, 2014, 3 pages.

(Continued)

*Primary Examiner* — Hai Vo
(74) *Attorney, Agent, or Firm* — Muncy, Geissler, Olds & Lowe, P.C.

(57) ABSTRACT

Provided is an electromagnetic wave shielding structure, including: a substrate; and a porous composite film formed on the substrate, wherein the porous composite film includes a continuous phase network fused from a plurality of metal nanoparticles, a first resin composition coated on a surface of the continuous phase network and a plurality of holes which are void spaces in the continuous phase network coated with the first resin composition.

18 Claims, 5 Drawing Sheets

(56) References Cited

U.S. PATENT DOCUMENTS

| | | | |
|---|---|---|---|
| 2008/0213609 A1* | 9/2008 | Jablonski et al. | 428/546 |
| 2008/0272344 A1* | 11/2008 | Jiang et al. | 252/513 |
| 2009/0008142 A1 | 1/2009 | Shimizu et al. | |
| 2009/0038839 A1 | 2/2009 | Hashimoto et al. | |
| 2010/0231433 A1 | 9/2010 | Tishin et al. | |
| 2011/0081527 A1 | 4/2011 | Yamato | |
| 2012/0251381 A1* | 10/2012 | Bedworth et al. | 420/469 |

FOREIGN PATENT DOCUMENTS

| | | |
|---|---|---|
| EP | 1886543 | 2/2008 |
| JP | 08-125380 | 5/1996 |
| JP | 2000269632 | 9/2000 |
| JP | 2006319216 | 11/2006 |
| JP | 2009194353 | 8/2009 |
| JP | 2009277980 | 11/2009 |
| JP | 2009290103 | 12/2009 |
| KR | 20080015447 | 2/2008 |
| KR | 10-0835658 B1 | 6/2008 |
| KR | 10-2009-0117827 A | 11/2009 |
| KR | 100995563 | 11/2010 |
| KR | 10-2012-0125614 A | 11/2012 |
| TW | M425512 | 3/2012 |
| WO | WO 2006088127 | 8/2006 |
| WO | WO 2006/121194 | 11/2006 |
| WO | WO 2006121194 | 11/2006 |
| WO | WO 2010067485 | 6/2010 |

OTHER PUBLICATIONS

Chung, "Electromagnetic interference shielding effectiveness of carbon materials", Carbon, 2001, vol. 39, pp. 279-285.

Zhang et al., "Preparation of highly conductive polymer nanocomposites by low temperature sintering of silver nanoparticles", Journal of Materials Chemistry, 2010, vol. 20, pp. 2018-2023.

Dearden, et al., "A Low Curing Temperature Silver Ink for Use in Ink-Jet Printing and Subsequent Production of Conductive Tracks", Macromol. Rapid Commun., 2005, vol. 26, pp. 315-318.

Notice of Allowance issued in corresponding Korean application No. 10-2013-0078608 on Oct. 22, 2014, and English translation thereof.

* cited by examiner

ELECTROMAGNETIC WAVE SHIELDING STRUCTURE AND METHOD FOR FABRICATING THE SAME

CROSS REFERENCE TO RELATED APPLICATIONS

All related applications are incorporated by reference. The present application is based on, and claims priority from, Taiwan (International) Application Serial Number No. 101143371, filed on Nov. 21, 2012, the disclosure of which is hereby incorporated by reference herein in its entirety.

TECHNICAL FIELD

The present disclosure relates to an electromagnetic wave shielding structure and a method for fabricating thereof.

BACKGROUND

For meeting the requirements of electronic and communication products, integrated circuit (IC) packages on a circuit substrate are thinned, lightened and shrinked. A density of I/O pins of the IC packages is increased, resulting from increased numbers of the I/O pins and reduced pitches between I/O circuits. In addition, in order to support high speed signal transmission, ICs work at high frequency. Thus, the electromagnetic interference (EMI) between the IC packages becomes more serious. It is highly desirable that the electromagnetic wave shielding performance for a product or a component can be correspondingly improved. The lifespan and reliability can be improved if the PCB can offer a function of electromagnetic wave shielding with providing the components a path to ground.

BRIEF SUMMARY

According to an embodiment of the present disclosure, an electromagnetic wave shielding structure is provided, including: a substrate; and a porous composite film formed on the substrate, wherein the porous composite film includes a continuous phase network fused from a plurality of metal nanoparticles, a first resin composition coated on a surface of the continuous phase network and a plurality of holes which are void spaces in the continuous phase network coated with the first resin composition.

According to an embodiment of the present disclosure, a method for fabricating an electromagnetic wave shielding structure is provided, the method including: providing a substrate; and forming a porous composite film on the substrate, wherein the porous composite film comprises a continuous phase network fused from a plurality of metal nanoparticles, a first resin composition coated on a surface of the continuous phase network and a plurality of holes which are void spaces in the continuous phase network coated with the first resin composition.

BRIEF DESCRIPTION OF THE DRAWINGS

The disclosure will now be described, by way of example, with reference to the accompanying drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An electromagnetic wave shielding structure according to embodiments of the present disclosure is provided. The electromagnetic wave shielding structure comprises a substrate and a porous composite film formed thereon. In particular, the porous composite film may be a flexible film and have good electromagnetic wave shielding performance.

Figure 1A:
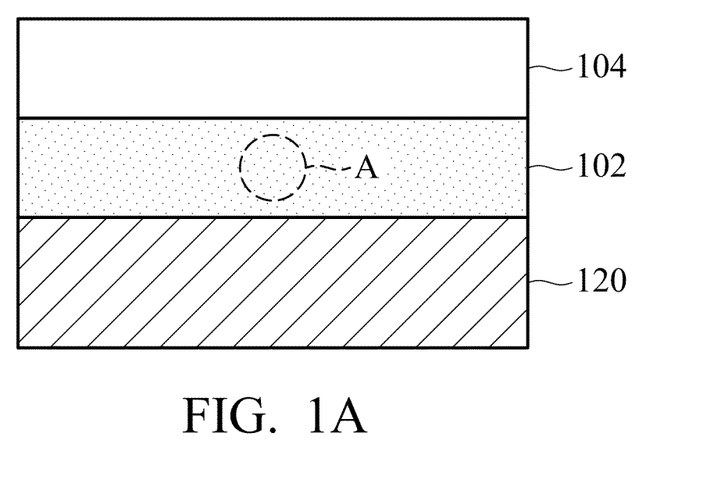
FIG. 1A shows a cross-sectional view of an electromagnetic wave shielding structure according to an embodiment of the present disclosure.

For example, FIG. 1A shows a cross-sectional view of an electromagnetic wave shielding structure according to an embodiment of the present disclosure. The electromagnetic wave shielding structure may be an electromagnetic wave shielding film. The electromagnetic wave shielding film may comprise a substrate 120, a porous composite film 102 formed on the substrate 120 and a conductive adhesive layer 104 formed on the porous composite film 102. The substrate 120 may be an insulating substrate, for example, comprising polyimide (PI), polyethylene terephthalate (PET), polyethylene naphthalate (PEN), polyethersulfone (PES), polyphenylene sulfide (PPS), epoxy resins, polyacrylic resins or combinations thereof. The porous composite film 102 may offer electromagnetic wave shielding (EMI shielding). The conductive adhesive layer 104 may be a semi-cured layer, and the electromagnetic wave shielding film is capable of adhering to other components which need the electromagnetic wave shielding.

Figure 1B:
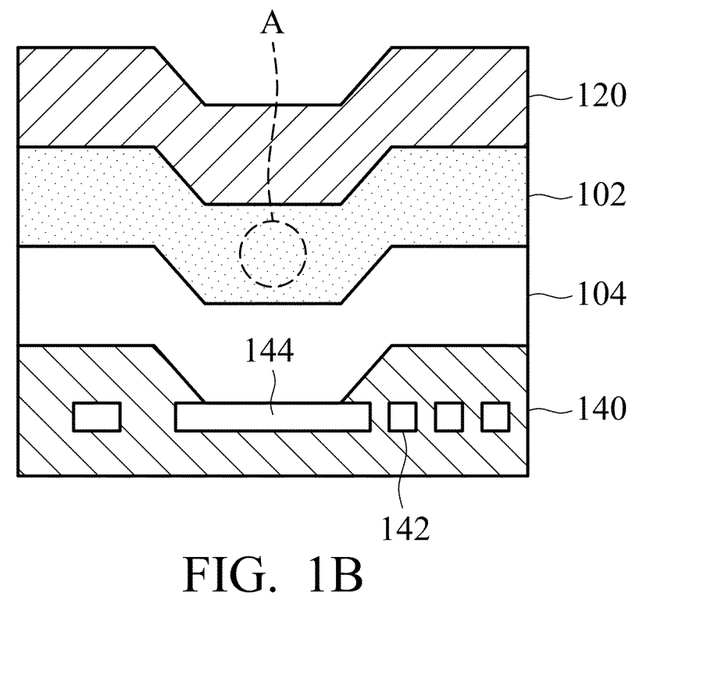
FIG. 1B shows cross-sectional view of an electromagnetic wave shielding structure according to another embodiment of the present disclosure.

FIG. 1B shows cross-sectional view of an electromagnetic wave shielding structure according to another embodiment of the present disclosure. The electromagnetic wave shielding structure may be a flexible PCB structure capable of offering electromagnetic wave shielding. For example, the electromagnetic wave shielding structure may be formed by adhering the electromagnetic wave shielding film shown in FIG. 1A to a flexible PCB 140 via the conductive adhesive layer 104. The flexible PCB 140 may comprise a plurality of signal traces 142 and at least one ground trace 144. In an embodiment, the conductive adhesive layer 104 may be electrically connected (e.g., directly contact) to the ground trace 144. In addition, in this embodiment, the conductive adhesive layer 140 may be a cured layer.

Figure 1C:
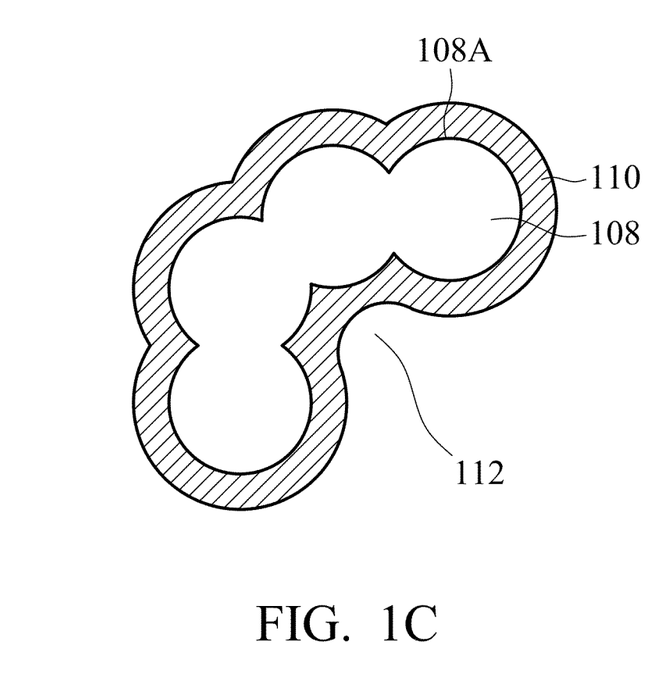
FIG. 1C shows an enlarged view of an area A of the porous composite film shown in FIGS. 1A and 1B.

FIG. 1C shows an enlarged view of an area A of the porous composite film shown in FIGS. 1A and 1B. As shown in FIG. 1C, the porous composite film 102 may comprise a continuous phase network fused from a plurality of metal nanoparticles 108 and a first resin composition 110 coated on a surface 108A of the continuous phase network. Thus, the porous composite film 102 may also comprise a plurality of holes 112 which are void spaces in the continuous phase network coated with the first resin composition 110. Note that although this figure merely shows several metal nanoparticles fused to each other, it is appreciated that the fused metal nanoparticles may extend along any direction and form the continuous phase network. Thus, the electromagnetic noise may be transmitted to the conductive adhesive layer 104 and the ground trace 144 via the continuous phase network, thereby providing electromagnetic wave shielding performance. In addition, the holes 112 of the porous composite film 102 may also enhance the adhesive strength between the porous composite film 102 and the conductive adhesive layer 104.

FIGS. 2A~2D show cross-sectional views of a flexible PCB having electromagnetic wave shielding at various fabrication stages according to an embodiment of the present disclosure. In this embodiment, same reference numbers mean similar materials or formation methods as described in the above embodiments.

Figure 2A:
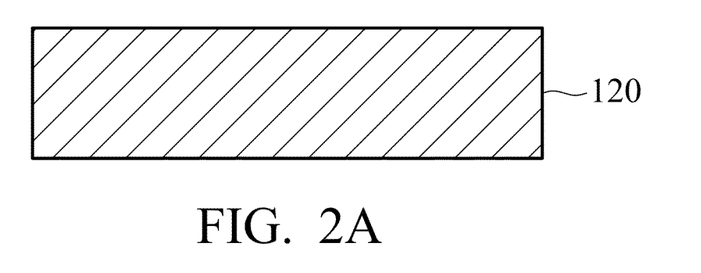
FIGS. 2A~2D show cross-sectional views of a flexible PCB having electromagnetic wave shielding at various fabrication stages according to an embodiment of the present disclosure.

Referring to FIG. 2A, an insulating substrate 120 is provided. In an embodiment, the insulating substrate 120 may be selected from polyimide (PI), polyethylene terephthalate (PET), polyethylene naphthalate (PEN), polyethersulfone (PES), polyphenylene sulfide (PPS), epoxy resins, polyacrylic resins or other insulating substrates capable of sustaining a high temperature. The insulating substrate 120 may have a thickness of between about 3 μm and about 25 μm.

Figure 2B:
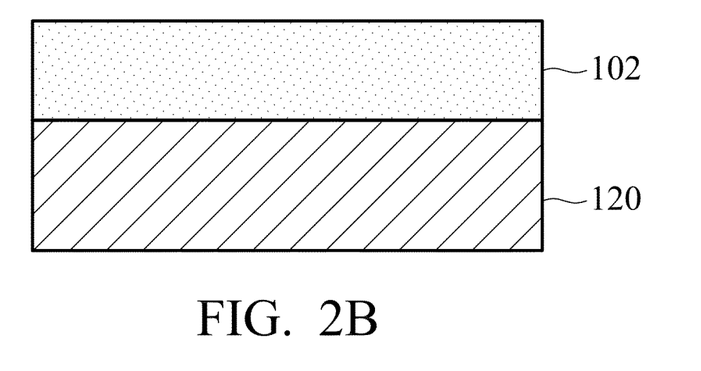

Next, referring to FIG. 2B, a porous composite film 102 is formed on the insulating substrate 120. In an embodiment, the porous composite film 102 may be formed by applying (e.g., coating) a first solution (not shown) onto the insulating substrate 120 and then performing a thermal treatment to the first solution on the insulating substrate 120. The first solution may comprise an organometallic complex and a first resin composition dispersed in a solvent. In an embodiment, the organometallic complex and the first resin composition may have a weight ratio of between about 20:1 and about 30:1. The organometallic complex may comprise $CH_3(CH_2)_mCOO^-Ag^+$, $[CH_3(CH_2)_mCOO^-]_2Ni^{2+}$, $[CH_3(CH_2)_mCOO^-]_3Al^{3+}$ or combinations thereof, wherein m is an integer from 0 to 8. The solvent of the first solution may be toluene, xylene, N-methyl pyrrolidinone (NMP) or combinations thereof. The first resin composition may be selected from the group consisting of a multi-functional epoxy resin, bisphenol-A type epoxy resin, cycloaliphatic epoxy resin, naphthalene-contained epoxy resin, diphenylene epoxy resin and novolac epoxy resin. The epoxy resin may have a weight average molecular of from about 1000 to about 5000.

In addition, the first resin composition may also comprise a polymer softener, a hardener and a catalyst. For example, the polymer softener may be selected from the group consisting of polyesters, polyamides, polyamide-imides, polyvinyl butyral, synthetic rubber, polycaprolactone, aliphatic epoxy resins and carboxyl terminated butadiene acrylonitrile (CTBN). The hardener may be selected from the group consisting of anhydrides, diamines or polyamines. For example, the hardener may be methyl hexahydrophthalic anhydride, methyltetrahydrophthalic anhydride, 4,4-diaminodiphenyl sulfone, polyether diamine or combinations thereof. The catalyst may comprise imidazole, such as 2-ethyl-4-methyl imidazole, 2,4-diamino-6[2-(2-methyl-1-imidazolyl)ethyl]-1,3,5-triazine, 2-methylimidazole or combinations thereof.

In an embodiment, the first resin composition may comprise about 50 to about 100 weight parts of an epoxy resins, 30 weight parts or less of the polymer softener (e.g., 0.1~30 weight parts), 10 weight parts or less of the hardener (e.g., 0.1~10 weight parts) and 10 weight parts or less of the catalyst (e.g., 0.1~10 weight parts).

In an embodiment, the thermal treatment to the first solution may comprise multi-stage heating. For example, the multi-stage heating may comprise heating in a hot air circulating oven by stages at a temperature of between about 50° C. and about 250° C. (or between about 90° C. and about 200° C.) for minutes to hours. In some embodiments, the multi-stage heating may comprise a 3-staged heating step, comprising heating at a temperature of between about 50° C. and about 90° C. for about 5~10 minutes, heating at a temperature of between about 140° C. and about 160° C. for about 30~60 minutes and heating at a temperature of between about 170° C. and about 250° C. for about 10~60 minutes. During the multi-stage heating, the solvent in the first solution may be gradually vaporized, the organometallic complex may decompose to a plurality of metal nanoparticles, and the epoxy resins of the first resin composition may be cross-linked and cured. It should be noted that the plurality of metal nanoparticles may also be fused together to form a continuous phase network, and the continuous phase network is coated and wrapped by the cross-linked first epoxy resins. In other words, the forming and the fusion of the metal nanoparticles are carried out simultaneously, and therefore a surface of the continuous phase network is coated with the cross-linked first epoxy resins. In an embodiment, the metal nanoparticles may comprise silver, nickel or aluminum nanoparticles. The metal nanoparticles may have an average diameter of between about 20 nm and about 200 nm.

Furthermore, in an optional embodiment, the first solution on the insulating substrate 120 may be exposed before performing the multi-stage heating. The exposure step may increase the decomposing rate of the organometallic complex, pre-define the porous composite film, and catalyze the cross-linking reaction of the epoxy resins. In an embodiment, the exposure step may comprise irradiating UV light at 1500~3000 mJ/cm$^2$ for 15 to 60 seconds.

As described above, the porous composite film 102 may comprise a plurality of holes formed from the void spaces in the continuous phase network coated with the first resin composition. In an embodiment, the holes may have an average diameter of between about 0.01 μm and about 0.5 μm. Since the forming and the fusion of the metal nanoparticles are carried out simultaneously, the sizes and stacked ways may be determined by the competition and cooperation results of the forming and the fusion of the metal nanoparticles. Thus, the average diameter of the holes may be determined by the rate of the fusion and the cross-linking reactions. For example, the average diameter of the holes may be controlled by adjusting temperature and/or time.

In an embodiment, the porous composite film 102 may have a thickness of between about 0.5 μm and about 5 μm. It should be noted that the porous composite film 102 will lose flexibility when it is too thick, and the porous composite film 102 will have poor electromagnetic wave shielding performance when it is too thin. In this embodiment, the porous composite film 102 may offer EMI shielding effectiveness from greater than 50 dB for frequencies up to 1 GHz.

Figure 2C:
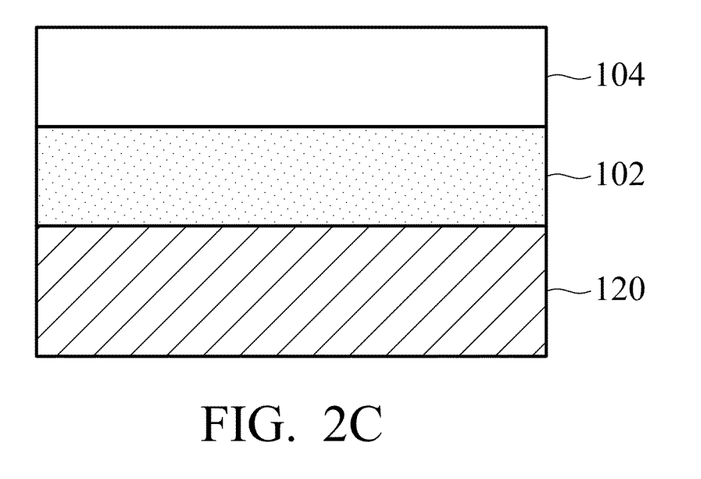

Then, referring to FIG. 2C, a conductive adhesive layer 104 is formed on the porous composite film 102. In an embodiment, the conductive adhesive layer 104 may be coated on the porous composite film 102. For example, the conductive adhesive layer 104 may be formed by coating a second solution (not shown) onto the porous composite film 102, and then performing a thermal treatment to the second solution on the porous composite film 102. The second solution may be a resin dispersion comprising a second resin composition which is dissolved therein and a conductive powder dispersed therein. The conductive powder may be silver, copper, nickel or combinations thereof. The conductive powder may have an average diameter of between about 0.5 μm and about 1.0 μm. The second resin composition may be selected from the group consisting of a multi-functional epoxy resin, bisphenol-A type epoxy resin, cycloaliphatic epoxy resin, naphthalene-contained epoxy resin, diphenylene epoxy resin and novolac epoxy resin. The epoxy resin may have a weight average molecular of from about 1000 to about 5000. In some embodiments, the first resin composition and the second resin composition may use the same material. Alternatively, the first resin composition and the second resin composition may use different materials. In an optional embodiment, the second resin composition may further comprise the polymer softener, the hardener and the catalyst described above. In some embodiments, the conductive powder and the second resin composition may have a weight ratio of between about 3:2 and about 4:1.

The thermal treatment to the second solution may comprise heating in a hot air circulating oven by stages at a temperature range of between about 50° C. and about 150° C. For example, heating at a temperature range of between about 70° C. and about 90° C. for about 5~12 minutes, heating at a temperature range of between about 90° C. and about 110° C. for about 2~10 minutes and heating at a temperature range of between about 110° C. and about 130° C. for about 1~8 minutes in sequence. In the multi-stage heating step, the solvent in the second solution may be gradually vaporized and the epoxy resins of the second resin composition may be cross-linked and semi-cured (so called as to b-stage). Note that the second resin composition is semi-cured for facilitating to adhesive another substrate thereafter. Accordingly, the electromagnetic wave shielding film shown in FIG. 1A is formed.

Figure 2D:
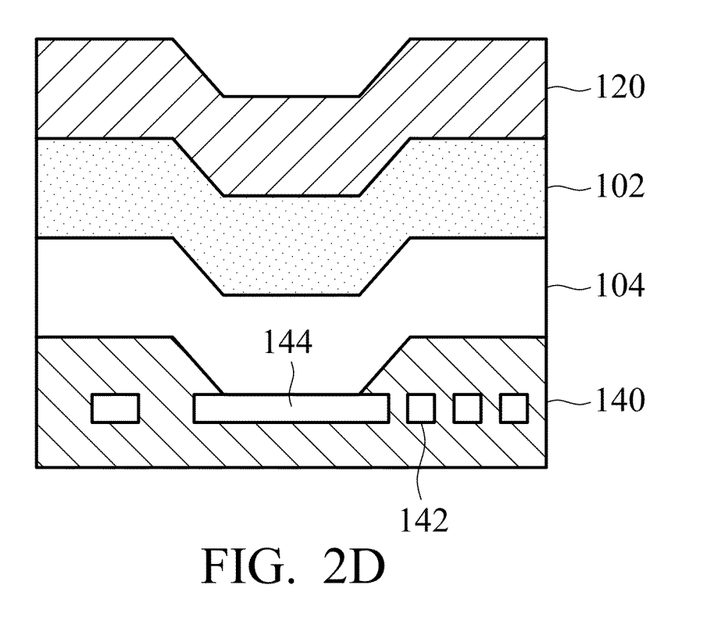

Next, referring to FIG. 2D, the semi-cured conductive adhesive layer 104 may be adhered to a flexible PCB 140, for example, by hot pressing at a temperature of about 170° C. to about 190° C. and at a pressure of about 70 kgf to about 90 kgf. During the hot-pressing, the epoxy resin in the conductive adhesive layer 104 may be further cured and adhered onto the flexible PCB 140. The flexible PCB 140 may comprise an exposed ground trace for directly contacting and electrically connecting to the conductive adhesive layer 104.

Since the porous composite film 102 itself comprises the epoxy resins, the porous composite film may have good adhesive strength with other films. The plurality of nano-sized holes of the porous composite film 102 can also enhance the adhesive strength with the conductive adhesive layer 104. In addition, the plurality of nano-sized holes may function as a buffer area for storing bubbles. Thus, the plurality of nano-sized holes may prevent the bubbles from leaking from the interface of the conductive adhesive layer 104 and the flexible PCB 140. The bubble leaking may result in delamination between the conductive adhesive layer 104 and the flexible PCB 140. In other words, in the embodiments of the present disclosure, the adhesive strength between the conductive adhesive layer 104 and the flexible PCB 140 may be greater than about 4N.

In summary, the electromagnetic wave shielding structure according to the present disclosure may have excellent electromagnetic wave shielding performance and flexibility, and may be fabricated by simple processes, needing no vacuum instrument for coating a metal film. Meanwhile, the adhesive strengthening between layers of the electromagnetic wave shielding structure may be enhanced by the porous composite film, and the broken and delamination problems may be improved or prevented. Thus, the electromagnetic wave shielding structure according to the present disclosure may be applied in various advanced techniques.

EXAMPLE 1

Preparation of the Organo-Silver Complex 20 g of neodecanoic acid, 17.3 g of triethanolamine and 200 g of deinoic water were stirred at room temperature for 30 minutes. 17.96 g of silver nitrate was dissolved in 50 g of deionic water. Then, the silver nitrate solution was slowly added to the other solution. White precipitates were obtained after stirring for 30 minutes. The white precipitates were collected and then washed for the removal of impurities. An organo-silver complex $(CH_3(CH_2)_8COO^-Ag^+)$ was obtained after vacuum drying.

EXAMPLE 2

Figure 3A:
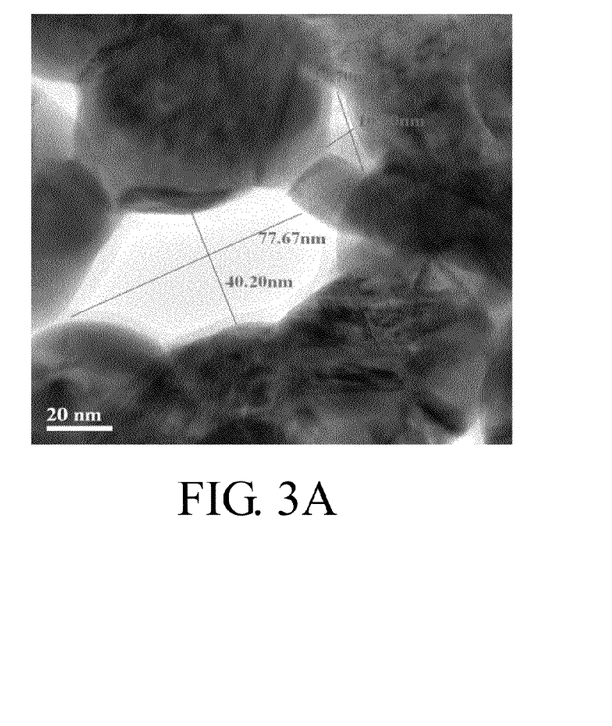
FIGS. 3A and 3B show TEM and SEM images of an electromagnetic wave shielding film according to an embodiment of the present disclosure.
Figure 3B:
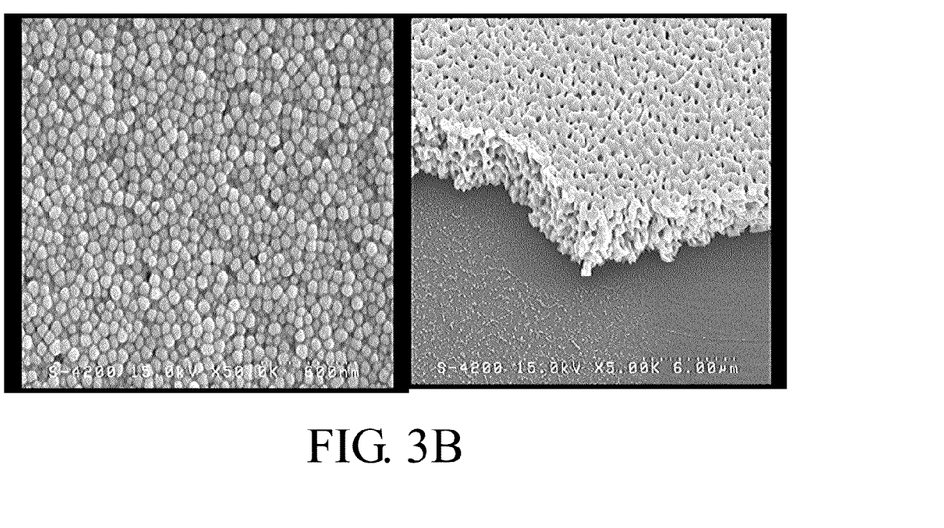

Preparation of the Porous Composite Film 10.0 g of the organo-silver complex of Example 1 was added to 2.5 g of toluene, and a solution A having a solid content of 80% was formed. 10.0 g of an epoxy resin (4221EL manufactured by Epolab Chemical Industries Inc.), 5.0 g of carboxyl-terminated butadiene acrylonitrile (CTBN), 1.0 g of methyl hexahydrophthalic anhydride and 0.04 g of 2-ethyl-4-methyl imidazole were added to 6.85 g of toluene, and a solution B having a solid content of 70% was formed. Then, 4.0 g of the solution A and 0.133 g of the solution B were mixed, and a solution C was formed. Then, the solution C was coated onto a polyimide substrate using blade coating. The solution C was exposed at 1500 mJ/cm$^2$ for 30 seconds. Then, a 3-staged heating step including heating at 90° C./5 mins, 150° C./1 hour and 200° C./0.5 hour in sequence was carried out in a hot air circulating oven for the removal of toluene and curing the epoxy resin. A porous composite film having a thickness of 3 μm was obtained. The transmission electron microscopy (TEM) and scanning electron microscopy (SEM) images are shown in FIGS. 3A and 3B, respectively.

EXAMPLE 3

The same procedure as in Example 2 was repeated for Example 3, except that the solution C was mixed by 4.0 g of the solution A and 0.2 g of the solution B.

EXAMPLE 4

The same procedure as in Example 2 was repeated for Example 4, except that the solution C was mixed by 4.0 g of the solution A and 0.4 g of the solution B.

EXAMPLE 5

The same procedure as in Example 2 was repeated for Example 5, except that the solution C was mixed by 4.0 g of the solution A and 0.1 g of the solution B.

EXAMPLE 6

Preparation of the Electromagnetic Wave Shielding Film 28.9 g of epoxy resins (4221EL manufactured by Epolab Chemical Industries Inc.), 100.2 g of a CTBN solution (20% CTBN in methyl ethyl ketone), 3.3 g of diamino diphenyl sulfone, and 0.065 g of 2-ethyl-4-methyl imidazole were added to 2.55 g of methyl ethyl ketone, and a solution D was formed, wherein the above epoxy resins comprised a mixture of 11.4 g bisphenol-A type epoxy resin (trade name "Epikote 828EL"), 11.3 g of bisphenol-A novolac type epoxy resin (BN200 manufactured by Changchun Group Corporate) and 6.21 g of brominated epoxy resin (Epicuron 153 manufactured by DaiNippon ink Chemical Co., Ltd). Then, 20.5 g of the solution D and 23.4 g of a nickel powder were added to 30.0 g of methyl ethyl ketone and stirred by a ball mill, and a dispersion E was formed. Then, the dispersion E was coated onto the porous composite film of the Example 2 using blade coating. Then, a 3-stage heating including heating at 80° C./7 mins, 100° C./4 min and 120° C./4 min in sequence was carried out in a hot air circulating oven for the removal of methyl ethyl ketone and partially curing the epoxy resin. A semi-cured conductive adhesive layer having a thickness of 16 µm was obtained.

EXAMPLE 7

The same procedure as in Example 6 was repeated for Example 7, except that the solution E was coated on the porous composite film of Example 3. A semi-cured conductive adhesive layer having a thickness of 16 µm was obtained.

EXAMPLE 8

The same procedure as in Example 6 was repeated for Example 8, except that the solution E was coated on the porous composite film of Example 4. A semi-cured conductive adhesive layer having a thickness of 16 µm was obtained.

EXAMPLE 9

The same procedure as in Example 6 was repeated for Example 9, except that the solution E was coated on the porous composite film of Example 5. A semi-cured conductive adhesive layer having a thickness of 16 µm was obtained.

EXAMPLE 10

The same procedure as in Example 6 was repeated for Example 10, except that only 20.0 g of nickel powder was added to solution E. A semi-cured conductive adhesive layer having a thickness of 15 µm was obtained.

EXAMPLE 11

The same procedure as in Example 6 was repeated for Example 11, except that 24.7 g of nickel powder was added to solution E. A semi-cured conductive adhesive layer having a thickness of 22 µm was obtained.

EXAMPLE 12

Preparation of the Flexible PCB Structure

A flexible PCB comprising copper trace patterns and an insulating layer thereon. Then, the electromagnetic wave shielding film of Example 6 was adhered to the flexible PCB using hot-pressing at a temperature of 190° C. and a pressure of 70 kgf for 60 minutes.

EXAMPLES 13~17

The same procedure as in Examples 12 was repeated for Examples 13~17, except that the electromagnetic wave shielding film of Examples 7~11 were adhered to the flexible PCB, respectively.

Measurement of Shielding Effectiveness of the Electromagnetic Wave Shielding Film The shielding effectiveness of the electromagnetic wave shielding film was measured as per ASTM-D4935 standards. The samples such as the electromagnetic wave shielding films of Examples 2~5 and 12~17 were diced to circular pieces having a diameter of 13 cm, and then measured at frequencies of between 30 MHz and 1.5 GHz. The results measured at 1 GHz are listed in Table 1.

In addition, surface resistivities of the electromagnetic wave shielding films in the flexible PCB structures of the Examples 12~17 were measured by a four point probe method. The results are listed in Table 1.

Measurement of the Adhesive Strength between the Electromagnetic Wave Shielding Film and a Polyimide Film The adhesive strength was measured as per IPC-TM-650 2.6.2 standards. The electromagnetic wave shielding films of Examples 6~11 were diced to 10 mm×70 mm pieces, and then adhered to another polyimide film by using hot-pressing at a temperature of 180° C. and a pressure of 70 kgf for 1 minute and thermal curing at a temperature of 170° C. for 60 minutes. Then, a T-peel test was carried out at a tensile rate of 50 min/minute. The results of the adhesive strength between the porous composite film and the polyimide film are listed in Table 1.

Bending Fatigue Test

The bending fatigue properties of the flexible PCB structures of Examples 12~17 were tested at a curvature radius of 0.38 mm, and weight loading of 500 g with a frequency of 180 times/minute. The bending fatigue properties are determined by the numbers of broken trace patterns. The results are listed in Table 1.

Soldering Resistance Test

The flexible PCB structures of Examples 12~17 were diced to 2.5 cm×12 cm pieces and immersed in a tin stove which was heated to 288° C. The pieces were picked up and their surfaces were observed for checking whether small bubbles were generated or not. The results are listed in Table 1.

TABLE 1

|  | Example 2 | Example 3 | Example 4 | Example 5 |
|---|---|---|---|---|
| Weight ratio of the solution A and the solution B | 30:1 | 20:1 | 10:1 | 40:1 |
| EMI shielding @1 GHz (dB) | 65 | 51 | 45 | 73 |

TABLE 1-continued

|  | Example 6 | Example 7 | Example 8 | Example 9 | Example 10 | Example 11 |
|---|---|---|---|---|---|---|
| Nickel powder weight (g) | 23.4 | 23.4 | 23.4 | 23.4 | 20 | 24.7 |
| Adhesive strength (N/cm) | 4.8 | 4.5 | 4.5 | 4.6 | 5.1 | 3.2 |

|  | Example 12 | Example 13 | Example 14 | Example 15 | Example 16 | Example 17 |
|---|---|---|---|---|---|---|
| EMI shielding @1 GHz (dB) | 58 | 52 | 50 | 64 | 48 | 55 |
| Total thickness of the porous composite film and the conductive adhesive layer (μm) | 19 | 19 | 20 | 18 | 20 | 25 |
| Surface resistance (mΩ/cm$^2$) | 300 | 330 | 350 | 150 | 1365 | 260 |
| Bending fatigue properties (curvature radius of 0.38 mm) | 2797 | 2934 | 2720 | 2154 | 4027 | 1846 |
| Soldering resistance (288° C.; 10 sec × 3) | pass | pass | pass | No pass | pass | No pass |

It can be known from Table 1 that the electromagnetic wave shielding films and the flexible PCB structures may have good EMI shielding performance, conductivity, adhesive strength and flexibility. When the weight ratio of the solution A and the solution B (i.e., the weight ratio of the epoxy resin and the organo-silver complex in the porous composite film) or the amount of the conductive powder is increased, the EMI shielding effectiveness can be also enhanced while slightly sacrificing the soldering resistance. However, the soldering resistance may be significantly increased when the amount of the conductive powder is not enough. Thus, the electromagnetic wave shielding films and the flexible PCB structures according to the present disclosure can meet various requirements by adjusting the weight ratio of the epoxy resin and the organo-silver complex in the porous composite film and the amount of the conductive powder.

While the embodiments have been described above, it will be recognized and understood that various modifications can be made to the disclosure and the appended claims are intended to cover all such modifications which may fall within the spirit and scope of the disclosure.

What is claimed is:

1. An electromagnetic wave shielding structure, comprising:
   a substrate;
   a porous composite film formed on the substrate, wherein the porous composite film comprises a continuous phase network fused from a plurality of metal nanoparticles, a first epoxy resin composition coated on a surface of the continuous phase network and a plurality of holes which are void spaces between the continuous phase network coated with the first epoxy resin composition; and
   a conductive adhesive layer formed on the porous composite film, wherein the conductive adhesive layer comprises a conductive powder.

2. The electromagnetic wave shielding structure of claim 1, wherein the first epoxy resin composition is essentially formed of an epoxy resins.

3. The electromagnetic wave shielding structure of claim 1, wherein the plurality of holes has an average diameter of between about 0.01 and about 0.5 μm.

4. The electromagnetic wave shielding structure of claim 1, wherein the conductive powder comprises nickel, silver, copper or combinations thereof.

5. The electromagnetic wave shielding structure of claim 1, wherein the conductive adhesive layer further comprises a second epoxy resin composition, and wherein the second epoxy resin composition is essentially formed of an epoxy resins.

6. The electromagnetic wave shielding structure of claim 5, wherein the porous composite film is flexible.

7. The electromagnetic wave shielding structure of claim 1, further comprising a flexible PCB adhered to the conductive adhesive layer.

8. The electromagnetic wave shielding structure of claim 7, wherein the flexible PCB comprises a ground trace electrically connected to the conductive adhesive layer.

9. A method for fabricating an electromagnetic wave shielding structure as claimed in claim 1, the method comprising:
   providing a substrate;
   forming a porous composite film on the substrate, wherein the porous composite film comprises a continuous phase network fused from a plurality of metal nanoparticles, a first epoxy resin composition coated on a surface of the continuous phase network and a plurality of holes which are void spaces between the continuous phase network coated with the first epoxy resin composition; and
   forming a conductive adhesive layer on the porous composite film, wherein the conductive adhesive layer comprises a conductive powder.

10. The method of claim 9, wherein the first epoxy resin composition is essentially formed of an epoxy resins.

11. The method of claim 9, wherein the step of forming the porous composite film comprises:
    applying a first solution onto the substrate, wherein the first solution comprises an organometallic complex and the first epoxy resin composition is dissolved in a solvent; and
    performing a thermal treatment to the first solution for decomposing the organometallic complex to the plurality of metal nanoparticles, fusing the plurality of metal nanoparticles together to form the continuous phase network, and curing the first epoxy resin composition.

12. The method of claim 11, wherein the organometallic complex comprises $CH_3(CH_2)_mCOO^-Ag^+$, $[CH_3(CH_2)_mCOO^-]_2Ni^{2+}$, $[CH_3(CH_2)_mCOO^-]_3Al^{3+}$ or combinations thereof, wherein m is an integer from 0 to 8.

13. The method of claim 11, wherein the step of performing a thermal step to the first solution comprises multi-stage heating.

14. The method of claim 11, further comprising exposing the first solution on the substrate before performing the thermal treatment to the first solution.

15. The method of claim 9, wherein the step of forming the conductive adhesive layer on the porous composite film comprises:
   applying a second solution onto the porous composite film, wherein the second solution comprises a conductive powder and a second epoxy resin composition; and
   performing a thermal treatment to the second solution for curing the second epoxy resin composition.

16. The method of claim 15, wherein the second epoxy resin composition is essentially formed of an epoxy resins.

17. The method of claim 9, further comprising adhering the conductive adhesive layer to a flexible PCB substrate.

18. The method of claim 9, wherein the electromagnetic wave shielding structure is flexible.

* * * * *